United States Patent
Koshihara

(10) Patent No.: US 10,340,428 B2
(45) Date of Patent: Jul. 2, 2019

(54) ELECTRO-OPTICAL DEVICE, METHOD FOR MANUFACTURING ELECTRO-OPTICAL DEVICE, AND ELECTRONIC APPARATUS

(71) Applicant: SEIKO EPSON CORPORATION, Tokyo (JP)

(72) Inventor: Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/812,289

(22) Filed: Nov. 14, 2017

(65) Prior Publication Data

US 2018/0138376 A1 May 17, 2018

(30) Foreign Application Priority Data

Nov. 17, 2016 (JP) .................. 2016-223711

(51) Int. Cl.
*H01L 33/50* (2010.01)
*H01L 33/60* (2010.01)
*H01L 27/32* (2006.01)

(52) U.S. Cl.
CPC ........ *H01L 33/505* (2013.01); *H01L 27/3241* (2013.01); *H01L 33/60* (2013.01); *H01L 2933/0041* (2013.01)

(58) Field of Classification Search
CPC ..................................................... H01L 33/60
See application file for complete search history.

(56) References Cited

U.S. PATENT DOCUMENTS

| | | | |
|---|---|---|---|
| 9,837,577 B2 * | 12/2017 | Kim | H01L 27/156 |
| 9,923,034 B2 * | 3/2018 | Jiang | H01L 27/322 |
| 2003/0107314 A1 | 6/2003 | Urabe et al. | |
| 2009/0215352 A1 | 8/2009 | Nishikawa et al. | |
| 2013/0187840 A1 | 7/2013 | Tomita et al. | |
| 2014/0117339 A1 * | 5/2014 | Seo | H01L 51/504 257/40 |
| 2014/0117842 A1 | 5/2014 | Hanamura | |
| 2016/0025302 A1 * | 1/2016 | Shiratori | H01L 27/322 362/231 |
| 2017/0062528 A1 * | 3/2017 | Aoyama | H01L 27/322 |
| 2017/0104045 A1 * | 4/2017 | Hanamura | H01L 51/5265 |

FOREIGN PATENT DOCUMENTS

| | | |
|---|---|---|
| JP | 2003-234186 A | 8/2003 |
| JP | 2004-227851 A | 8/2004 |
| JP | 2010-237384 A | 10/2010 |
| JP | 2013-175433 A | 9/2013 |
| JP | 2013-258021 A | 12/2013 |
| JP | 2014-089804 A | 5/2014 |

* cited by examiner

*Primary Examiner* — Caridad Everhart
*Assistant Examiner* — Ankush Singal
(74) *Attorney, Agent, or Firm* — Oliff PLC

(57) ABSTRACT

There is provided an electro-optical device including a light-emitting layer that has a first light-emitting element and a second light-emitting element which are adjacent to each other and a color filter layer that has a first color filter provided corresponding to the first light-emitting element and a second color filter provided corresponding to the second light-emitting element, in which an inter-element distance between the first light-emitting element and the second light-emitting element is 1.5 μm or less, and a thickness of layer between the light-emitting layer and the color filter layer is 6 times or less the inter-element distance.

11 Claims, 9 Drawing Sheets

ELECTRO-OPTICAL DEVICE, METHOD FOR MANUFACTURING ELECTRO-OPTICAL DEVICE, AND ELECTRONIC APPARATUS

BACKGROUND

1. Technical Field

The present invention relates to an electro-optical device, a method for manufacturing an electro-optical device, and an electronic apparatus.

2. Related Art

In an electro-optical device including a light-emitting element such as an organic electro luminescent (EL) element, in order to realize color display, a configuration is known in which a color filter that transmits light in a desired wavelength region is provided on a sealing layer that covers the light-emitting element. For example, in JP-A-2010-237384 and JP-A-2004-227851, a configuration is disclosed, in which a red color filter that transmits red light, a green color filter that transmits green light, and a blue color filter that transmits blue light are disposed on a sealing layer that covers a light-emitting element.

In recent years, a pitch of a pixel provided in an electro-optical device is becoming narrower, and for example, an electro-optical device having a narrow pitch of a pixel, for example, the pitch of the pixel that is 10 µm or less, has been developed. As the pitch of the pixel becomes narrower, the interval between light-emitting elements becomes narrower and the width of a color filter provided corresponding to each light-emitting element also becomes narrower. For this reason, as the pitch of the pixel becomes narrower, a maximum value of an angle formed by a traveling direction of the light transmitting the color filter provided corresponding to the light-emitting element among the light emitted from the light-emitting element and a direction perpendicular to the color filter becomes small, resulting in a problem that a viewing angle of the electro-optical device becomes narrower.

SUMMARY

An advantage of some aspects of the invention is to provide a technique capable of securing a sufficient viewing angle even when the pitch of the pixel becomes narrower.

According to an aspect of the invention, there is provided an electro-optical device including a light-emitting layer that has a first light-emitting element and a second light-emitting element which are adjacent to each other and a color filter layer that has a first color filter provided corresponding to the first light-emitting element and a second color filter provided corresponding to the second light-emitting element, in which an inter-element distance between the first light-emitting element and the second light-emitting element is 1.5 µm or less, and a thickness of layer between the light-emitting layer and the color filter layer is 6 times or less the inter-element distance.

According to the aspect of the invention, even in a case where the interval between the light-emitting elements is narrowed to 1.5 µm or less, since the interval between the light-emitting element and the color filter layer is narrowed to 6 times or less the inter-element distance, it is possible to maintain good viewing angle characteristics as compared with the case where the interval between the light-emitting element and the color filter layer is larger than 6 times the inter-element distance.

The above-described electro-optical device includes a first resonator that has a first light-emitting element and enhances the intensity of light in a first wavelength region, and a second resonator that has a second light-emitting element and enhances the intensity of light in a second wavelength region, in which the first color filter may transmit light from the first resonator, and the second color filter may transmit light from the second resonator.

According to this aspect, since the light in the first wavelength region is incident on the first color filter and the light in the second wavelength region is incident on the second color filter, it is possible to increase the color purity of display in the electro-optical device as compared with the case where the light in all wavelength regions of visible light is incident on the first color filter and the second color filter.

The above-described electro-optical device includes a filling layer that covers the color filter layer and a protective substrate that covers the filling layer, in which a maximum value of an angle that is formed by a traveling direction of the light emitted from the first light-emitting element and transmitted through the protective substrate after transmitting through the first color filter and the filling layer, and a direction perpendicular to the protective substrate is 10 degrees or more.

According to this aspect, since it is possible to secure a viewing angle of 10 degrees or more, the convenience of a user of the electro-optical device may be improved as compared with the case where only the viewing angle less than 10 degrees may be secured.

The above-described electro-optical device includes a filling layer that covers the color filter layer, and a thickness of layer between the light-emitting layer and the filling layer is 9 times or less the inter-element distance.

According to this aspect, since the interval between the light-emitting element and the filling layer is narrowed to 9 times or less the inter-element distance, it is possible to maintain good viewing angle characteristics as compared with the case where the interval between the light-emitting element and the filling layer is larger than 9 times the inter-element distance.

In the electro-optical device described above, the second color filter may be formed on a part of the first color filter, and the light transmitted through the first color filter may have higher visibility than the light transmitted through the second color filter.

Since the light transmitted through the first color filter has higher visibility than the light transmitted through the second color filter, the possibility that peeling-off of the first color filter is visually recognized as a color change is higher than the possibility that peeling-off of the second color filter is visually recognized as a color change. On the other hand, according to this aspect, since at least a part of the first color filter is protected by the second color filter, it is possible to reduce the possibility that the first color filter peels off. Therefore, according to this aspect, it is possible to reduce the possibility that the color change due to peeling-off of the color filter is visually recognized.

The above-described electro-optical device includes a sealing layer that is formed between the light-emitting layer and the color filter layer; and a convex portion that is formed between the first color filter and the second color filter, that is between the sealing layer and the color filter layer.

According to this aspect, since the convex portion is provided between a position where the first color filter is to be formed and a position where the second color filter is to be formed, it is possible to reduce the possibility that the second color filter is erroneously formed at the position where the first color filter is to be formed, and the first color filter is erroneously formed at the position where the second color filter is to be formed. In this way, it is possible to suppress the possibility that the display quality of the electro-optical device is degraded due to a manufacturing error.

In addition, according to another aspect of the invention, there is provided a method for manufacturing electro-optical device including: forming a light-emitting layer that has a first light-emitting element and a second light-emitting element which are adjacent to each other, forming a color filter layer that has a first color filter corresponding to the first light-emitting element and a second color filter corresponding to the second light-emitting element, in which an inter-element distance between the first light-emitting element and the second light-emitting element is 1.5 μm or less, and a thickness of layer between the light-emitting layer and the color filter layer is 6 times or less the inter-element distance.

According to the aspect of the invention, even in a case where the interval between the light-emitting elements is narrowed to 1.5 μm or less, since the interval between the light-emitting element and the color filter layer is narrowed to 6 times or less the inter-element distance, it is possible to maintain good viewing angle characteristics as compared with the case where the interval between the light-emitting element and the color filter layer is larger than 6 times the inter-element distance.

Furthermore, in addition to the electro-optical device, the invention may be conceived as an electronic apparatus equipped with the electro-optical device. Typical examples of the electronic apparatus include display devices such as a head mount display (HMD) and an electronic viewfinder.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments for carrying out the invention will be described with reference to the drawings. However, in each view, the dimensions and the scale of each unit are appropriately different from the actual ones. In addition, since the embodiments described below are preferred specific examples of the invention, various technically preferable limitations are given, but in the following description, the scope of the invention is not limited to these forms unless otherwise stated to limit the invention.

A. EMBODIMENT

Hereinafter, an electro-optical device 1 according to the present embodiment will be described.

1. Outline of Electro-Optical Device

Figure 1:
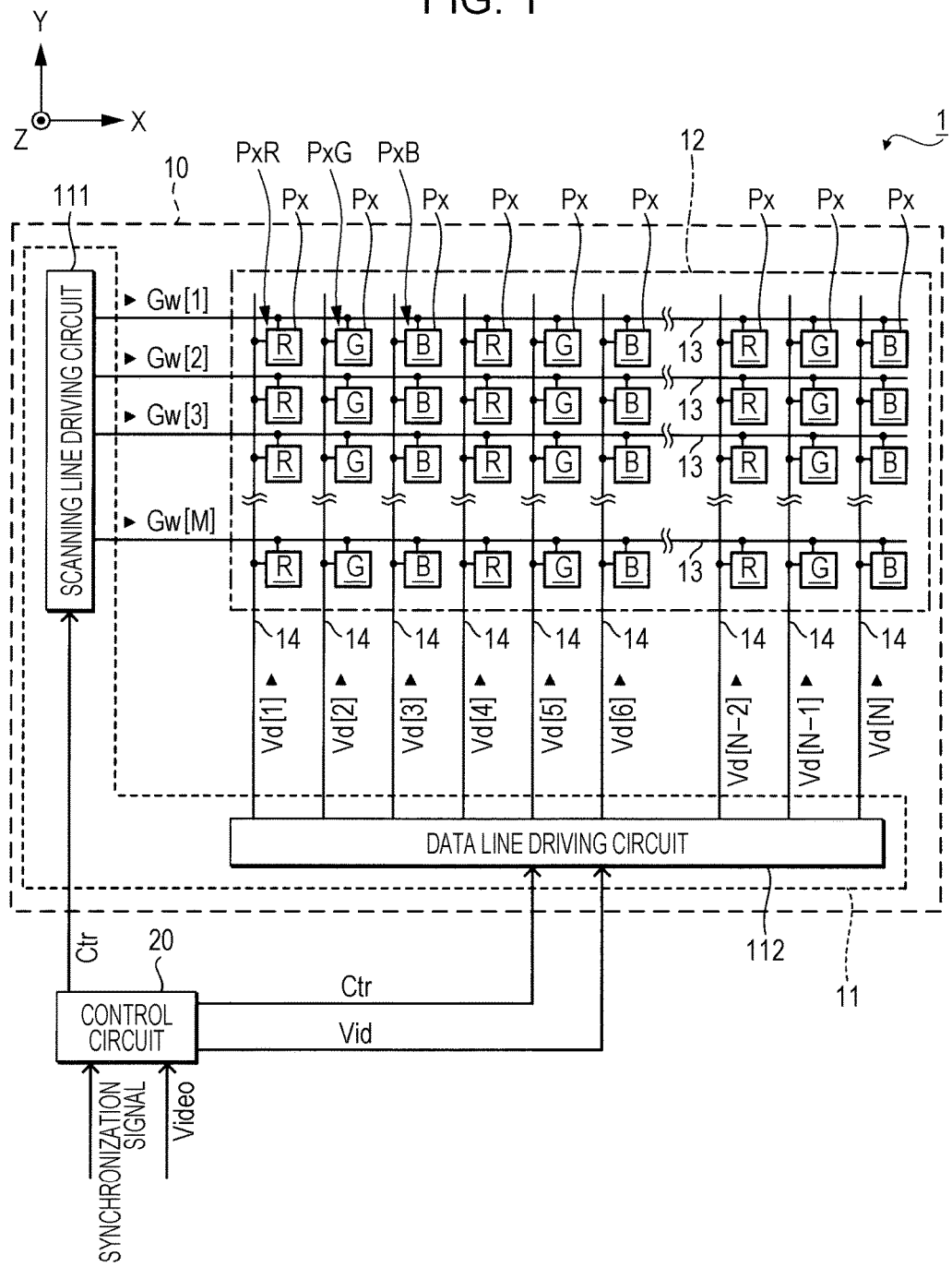
FIG. 1 is a block view showing an example of a configuration of an electro-optical device according to an embodiment of the invention.

FIG. 1 is a block view showing an example of a configuration of the electro-optical device 1 according to the embodiment.

As shown in FIG. 1, the electro-optical device 1 includes a display panel 10 having a plurality of pixels Px and a control circuit 20 controlling the operation of the display panel 10.

Digital image data Video is supplied to the control circuit 20 from a host device (not shown) synchronously with the synchronization signal. Here, the image data Video is digital data that defines a gradation level to be displayed by each pixel Px of the display panel 10. In addition, the synchronization signal is a signal including a vertical synchronization signal, a horizontal synchronization signal, a dot clock signal, and the like.

The control circuit 20 generates a control signal Ctr for controlling the operation of the display panel 10 based on the synchronization signal and supplies the generated control signal Ctr to the display panel 10. In addition, the control circuit 20 generates an analog image signal Vid based on the image data Video and supplies the generated image signal Vid to the display panel 10. Here, the image signal Vid is a signal that defines the luminance of the light-emitting element of the pixel Px so that each pixel Px displays the gradation specified by the image data Video.

As shown in FIG. 1, the display panel 10 includes M scanning lines 13 extending in an X direction and data lines 14 of N columns extending in a Y direction, a display unit 12 having M×N pixels Px arranged in a matrix of M rows×N columns corresponding to the intersections of the scanning line 13 of M rows and the data line 14 of N columns, and a driving circuit 11 that drives the display unit 12 (M is a natural number of 1 or more. N is a natural number of 3 or more).

Hereinafter, in order to distinguish the plurality of pixels Px, a plurality of scanning lines 13, and a plurality of data lines 14 from each other, from a +Y direction to a −Y direction, the rows are referred to as a first row, a second row, ..., an M-th row (Hereinafter, the +Y direction and the −Y direction are collectively referred to as a "Y-axis direction"), and from a −X direction to a +X direction, the columns are referred to as a first column, a second column, ..., an N-th column (Hereinafter, the +X direction and the −X direction are collectively referred to as an "X-axis direction").

The plurality of pixels Px provided on the display unit 12 include a pixel PxR capable of displaying red (R), a pixel PxG capable of displaying green (G), and a pixel PxB capable of displaying blue (B). Then, in the embodiment, a case where k is a variable representing a natural number of a multiple of 3 that satisfies 3≤k≤N, the pixel PxR is arranged in a (k−2)th column among the first column to the N-th column, the pixel PxG is arranged in the (k−1)th column, and the pixel PxB is arranged in the k-th column is assumed as an example.

As shown in FIG. 1, the driving circuit 11 includes a scanning line driving circuit 111 and a data line driving circuit 112.

The scanning line driving circuit 111 sequentially scans (selects) the scanning lines 13 of the first row to the M-th row. Specifically, the scanning line driving circuit 111 sequentially selects the scanning lines 13 for each horizontal scanning period in units of one frame by setting scanning signals Gw[1] to Gw[M] to be output to the respective scanning lines 13 of the first row to the M-th row to a predetermined selection potential sequentially in each horizontal scanning period. In other words, the scanning line driving circuit 111 selects the scanning line 13 of the m-th row in the m-th horizontal scanning period of one frame period by setting the scanning signal Gw[m] to be output to the scanning line 13 of the m-th row to the predetermined selection potential (m is a natural number satisfying 1≤m≤M). The period of one frame is a period during which the electro-optical device 1 displays one image.

Based on the image signal Vid and the control signal Ctr supplied from the control circuit 20, the data line driving circuit 112 generates analog data signals Vd[1] to Vd[N] that define the gradation to be displayed by each pixel P and outputs the generated data signals Vd[1] to Vd[N] to the data lines 14 of N columns for each horizontal scanning period. In other words, in each horizontal scanning period, the data line driving circuit 112 outputs a data signal Vd[n] (n is a natural number satisfying 1≤n≤N) to the data line 14 of the n-th column.

In the embodiment, the image signal Vid output from the control circuit 20 is an analog signal, but the image signal Vid output from the control circuit 20 may be a digital signal. In this case, the data line driving circuit 112 converts the image signal Vid to generate analog data signals Vd[1] to Vd[N].

Figure 2:
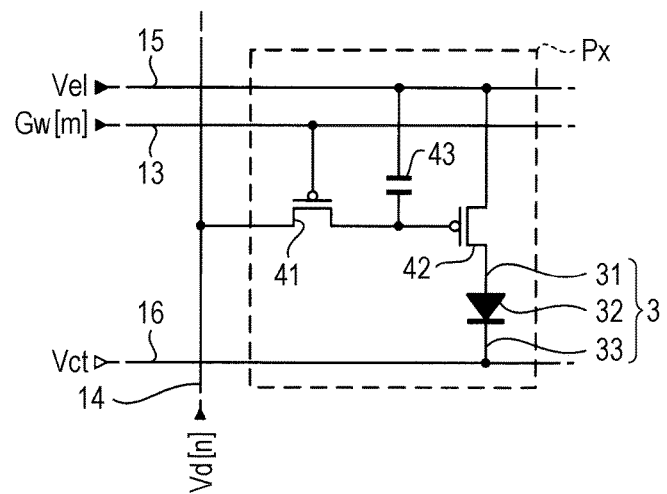
FIG. 2 is an equivalent circuit view showing an example of a configuration of a pixel.

FIG. 2 is an equivalent circuit view showing an example of a configuration of a pixel circuit 100 provided corresponding to each pixel Px in a one-to-one correspondence. In the embodiment, it is assumed that a plurality of pixel circuits 100 corresponding to the plurality of pixels Px are electrically identical to each other. In FIG. 2, the pixel circuit 100 provided corresponding to the pixel Px in the m-th row and the n-th column will be described by way of example.

The pixel circuit 100 includes a light-emitting element 3 included in the pixel Px corresponding to the pixel circuit 100, a P-channel MOS type transistors 41 and 42, and a storage capacitor 43. One or both of the transistors 41 and 42 may be N-channel MOS type transistors. In addition, the transistors 41 and 42 may be thin film transistors or field effect transistors.

The light-emitting element 3 includes a pixel electrode 31, a light-emitting function layer 32, and a counter electrode 33. The pixel electrode 31 functions as an anode for supplying holes to the light-emitting function layer 32. The counter electrode 33 is electrically connected to a feeder line 16 set at a potential Vct which is a power source potential on the low potential side of the pixel circuit 100 and functions as a cathode for supplying electrons to the light-emitting function layer 32. Then, the holes supplied from the pixel electrode 31 and the electrons supplied from the counter electrode 33 are coupled to the light-emitting function layer 32, and the light-emitting function layer 32 emits white light.

As will be described later in detail, a red color filter 8R is superimposed on the light-emitting element 3 (hereinafter, referred to as a light-emitting element 3R) of the pixel PxR, In t of the pixel PxG, a green color filter 8G is superimposed on the light-emitting element 3 (hereinafter, referred to as a light-emitting element 3G), and a blue color filter 8B is superimposed on a light-emitting element 3 (hereinafter, referred to as a light-emitting element 3B) included in the pixel PxB. Therefore, full-color display is enabled by the pixel PxR, the pixel PxG, and the pixel PxB.

In the embodiment, the light-emitting element 3G is an example of a "first light-emitting element", and the color filter 8G provided corresponding to the light-emitting element 3G is an example of the a "first color filter". In addition, one of the light-emitting elements 3B adjacent in the +X direction or the light-emitting elements 3R adjacent in the −X direction with the light-emitting element 3G which is the first light-emitting element is an example of a "second light-emitting element", and one of the color filters provided corresponding to the second light-emitting element, that is, one of the color filter 8B and the color filter 8R is an example of a "second color filter".

The gate of the transistor 41 is electrically connected to the scanning line 13 of the m-th row, one of the source and the drain is electrically connected to the data line 14 of the n-th column, and the other of the source and the drain is electrically connected to the gate of the transistor 42 and one of the two electrodes included in the storage capacitor 43.

The gate of the transistor 42 is electrically connected to the other of the source or the drain of the transistor 41 and one electrode of the storage capacitor 43, one of the source and the drain is electrically connected to a feeder line 15 set to a potential Vel which is a power source potential on the high potential side of the pixel circuit 100, and the other of the source and the drain is electrically connected to the pixel electrode 31.

In the storage capacitor 43, one of the two electrodes included in the storage capacitor 43 is electrically connected to the other of the source and the drain of the transistor 41 and the gate of the transistor 42, and the other electrode of the two electrodes of the storage capacitor 43 is electrically connected to the feeder line 15. The storage capacitor 43 functions as a storage capacitor for holding the potential of the gate of the transistor 42.

When the scanning line driving circuit 111 sets the scanning signal Gw[m] to a predetermined selection potential and selects the scanning line 13 of the m-th row, the transistor 41 provided in the pixel Px of the m-th row and the n-th column is turned on. Then, when the transistor 41 is turned on, the data signal Vd[n] is supplied from the data line 14 of the n-th column to the gate of the transistor 42. In this case, the transistor 42 supplies a current corresponding to the potential (to be precise, a potential difference between the gate and the source) of the data signal Vd[n] supplied to the gate to the light-emitting element 3. Then, the light-emitting element 3 emits light with luminance corresponding to the magnitude of the current supplied from the transistor 42, that is, luminance corresponding to the potential of the data signal Vd[n].

Thereafter, in a case where the scanning line driving circuit 111 releases the selection of the scanning line 13 of the m-th row and the transistor 41 is turned off, the potential of the gate of the transistor 42 is held by the storage capacitor 43. Therefore, even after the transistor 41 is turned off, the light-emitting element 3 may emit light with luminance corresponding to the data signal Vd[n].

2. Configuration of Display Unit

Hereinafter, the configuration of the display unit 12 according to the embodiment will be described with reference to FIGS. 3 and 4.

Figure 3:
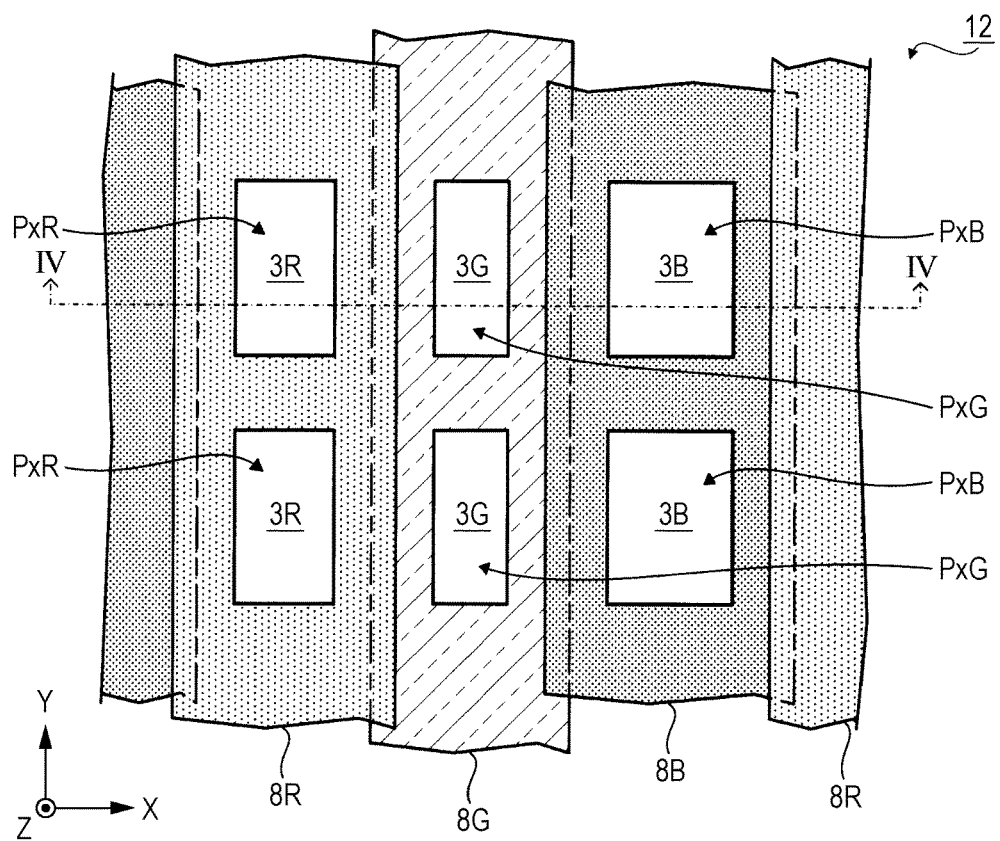
FIG. 3 is a plan view showing an example of a configuration of a display unit.

FIG. 3 is a plan view showing an example of a schematic structure of the display unit 12 according to the embodiment.

Specifically, FIG. 3 shows a case where a part of the display unit 12 is viewed in a plan view from a +Z direction (hereinafter, a +Z direction and a −Z direction are collectively referred to as a "Z axis direction"), which is a direction in which the electro-optical device 1 emits light. The Z axis direction is a direction crossing the X axis direction and the Y axis direction.

As shown in FIG. 3, on the M light-emitting elements 3G (+Z direction) included in the M pixels PxG arranged in the Y axis direction in the (k−1)th column of the display unit 12, the green color filter 8G is disposed so as to cover the M light-emitting elements 3G. The color filter 8G transmits light with the maximum luminance of green light, for example, light having a wavelength of 540 nm. In addition, on the M light-emitting elements 3B (+Z direction) included in the M pixels PxB arranged in the Y axis direction in the k-th column of the display unit 12, the blue color filter 8B is disposed so as to cover the M light-emitting elements 3B. The color filter 8B transmits light with the maximum luminance of blue light, for example, light having a wavelength of 470 nm. In addition, on the M light-emitting elements 3R (+Z direction) included in the M pixels PxR arranged in the Y axis direction in the (k−2)th column of the display unit 12, the red color filter 8R is disposed so as to cover the M light-emitting elements 3R. The color filter 8R transmits light with the maximum luminance of red light, for example, light having a wavelength of 610 nm.

The green light transmitting through the color filter 8G which is an example of the first color filter is an example of "light in a first wavelength region". In addition, the light transmitted through the color filter 8B or the color filter 8R as an example of the second color filter, that is, one of the blue light and the red light is an example of "the light in a second wavelength region". That is, in the embodiment, the light in the first wavelength region has higher visibility than the light in the second wavelength region.

Figure 4:
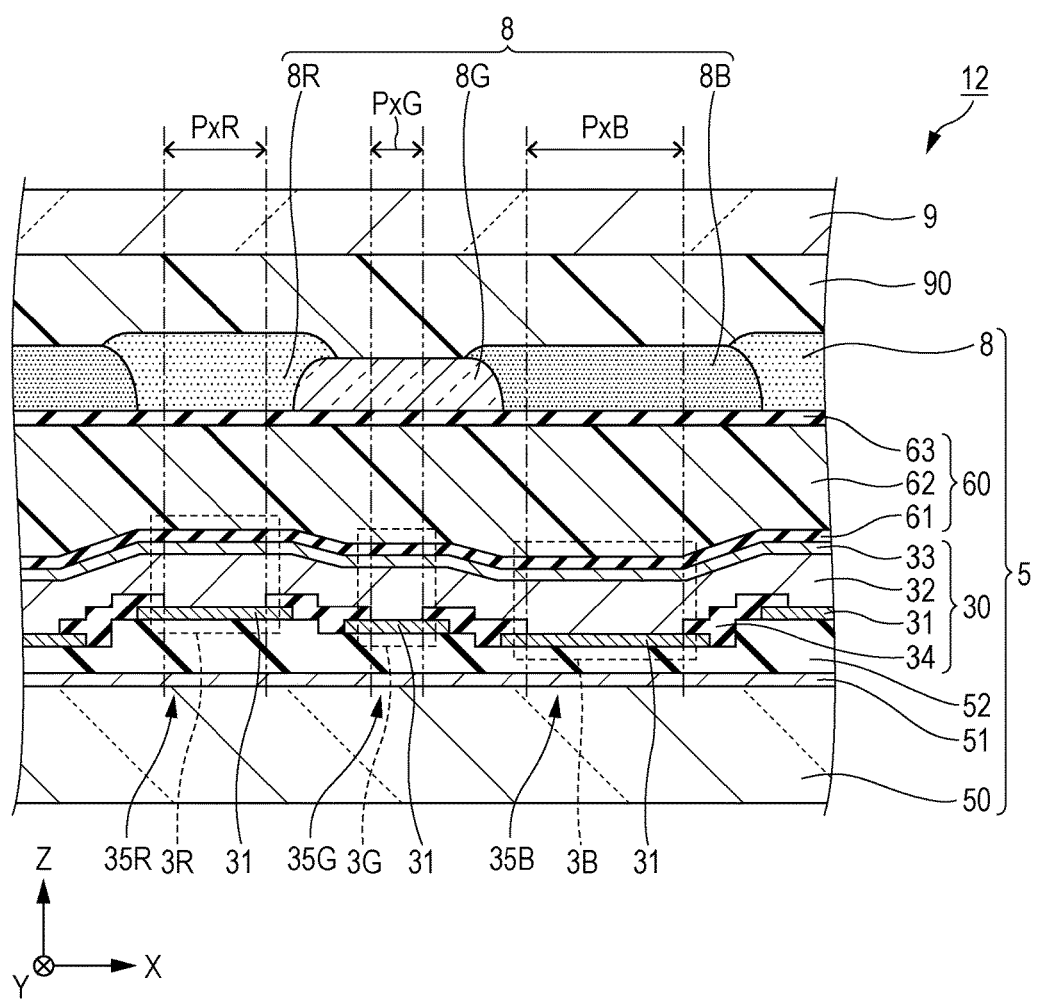
FIG. 4 is a partial cross-sectional view showing an example of the configuration of the display unit.

FIG. 4 is an example of a partial cross-sectional view taken along a line IV-IV in FIG. 3 of the display unit 12, in which a cross section of the pixel PxR, a cross section of the pixel PxG, and a cross section of the pixel PxB are included.

As shown in FIG. 4, the display unit 12 includes an element substrate 5, a protective substrate 9, and an adhesive layer 90 (an example of a "filling layer") provided between the element substrate 5 and the protective substrate 9. In the embodiment, it is assumed that the electro-optical device 1 is a top emission type in which light is emitted from the protective substrate 9 side (+Z side).

The adhesive layer 90 is a transparent resin layer for bonding the element substrate 5 and the protective substrate 9. The adhesive layer 90 is formed using a transparent resin material such as an epoxy resin or an acrylic resin, for example.

The protective substrate 9 is a transparent substrate disposed on the +Z side of the adhesive layer 90. As the protective substrate 9, for example, a quartz substrate, a glass substrate or the like may be adopted.

The element substrate 5 includes a substrate 50, a reflective layer 51, a distance adjusting layer 52, a light-emitting layer 30, a sealing layer 60, and a color filter layer 8 stacked on the substrate 50. Although details will be described later, the light-emitting layer 30 includes the light-emitting element 3 (3R, 3G, and 3B) described above. The light-emitting element 3 emits light in the +Z direction and the −Z direction. In addition, the color filter layer 8 includes the color filter 8R, the color filter 8G, and the color filter 8B described above.

The substrate 50 is a substrate on which various wirings such as the scanning line 13 and the data line 14, and various circuits such as the driving circuit 11 and the pixel circuit 100 are mounted. The substrate 50 may be any substrate as long as various wirings and various circuits may be mounted. As the substrate 50, for example, a silicon substrate, a quartz substrate, a glass substrate, or the like may be adopted. On the +Z side of the substrate 50, a reflective layer 51 is stacked.

The reflective layer 51 is a constituent element for reflecting the light emitted from the light-emitting element 3 of the light-emitting layer 30 to the +Z direction side. The reflective layer 51 is formed using a material with high reflectance, for example, aluminum, silver or the like. On the +Z side of the reflective layer 51, the distance adjusting layer 52 is stacked.

The distance adjusting layer 52 is an insulating transparent layer for adjusting the optical distance between the light-emitting element 3 and the reflective layer 51 of the light-emitting layer 30. The distance adjusting layer 52 is formed using an insulating transparent material, for example, silicon oxide (SiOx) or the like. On the +Z side of the distance adjusting layer 52, the light-emitting layer 30 is laminated.

The light-emitting layer 30 includes the pixel electrode 31 stacked on the distance adjusting layer 52, an insulating film 34 stacked on the distance adjusting layer 52 and the pixel electrode 31, the light-emitting function layer 32 stacked so as to cover the pixel electrode 31 and the insulating film 34, and the counter electrode 33 stacked on the light-emitting function layer 32.

The pixel electrode 31 is a transparent layer having conductivity formed in an island shape individually for each pixel Px. The pixel electrode 31 is formed using a conductive transparent material, for example, indium tin oxide (ITO), indium zinc oxide (IZO), or the like.

The insulating film 34 is an insulating constituent element arranged so as to cover the peripheral portion of each pixel electrode 31. The insulating film 34 is formed using an insulating material, for example, silicon oxide or the like.

The counter electrode 33 is a conductive constituent element having optical transparency and light reflectivity disposed so as to straddle the plurality of pixels Px. The counter electrode 33 is formed using, for example, an alloy of Mg and Ag or the like.

The light-emitting function layer 32 includes a hole injecting layer, a hole transporting layer, an organic light-emitting layer, and an electron transporting layer and is disposed so as to extend over a plurality of pixels Px. As described above, in the light-emitting function layer 32, holes are supplied from a portion of the pixel electrode 31 that is not covered with the insulating film 34 and emits white light. That is, in the plan view, the portion of the light-emitting layer 30 where the pixel electrode 31 is not covered with the insulating film 34 corresponds to the light-emitting element 3. In other words, the insulating film 34 functions as a "partition portion" that partitions the two light-emitting elements 3 adjacent to each other.

In addition, in the embodiment, in the plan view, the portion where the light-emitting element 3 is provided is regarded as the pixel Px. In other words, in the plan view, the insulating film 34 is disposed so as to partition the plurality of pixels Px of the display unit 12 from each other. The white light emitted from the light-emitting element 3 is light including red light, green light, and blue light.

In the embodiment, the film thickness of the distance adjusting layer 52 is adjusted so that an optical resonance structure is formed by the reflective layer 51 and the counter electrode 33. Then, the light emitted from the light-emitting function layer 32 is repeatedly reflected between the reflective layer 51 and the counter electrode 33 to strengthen the intensity of light having a wavelength corresponding to the optical distance between the reflective layer 51 and the counter electrode 33, and the intensified light is emitted to the +Z side to the protective substrate 9 via the counter electrode 33.

In the embodiment, as an example, the film thickness of the distance adjusting layer 52 is set for each pixel Px so that the intensity of light having a wavelength of 610 nm is intensified in the pixel PxR, the intensity of light having a wavelength of 540 nm is intensified in the pixel PxG, and the intensity of light having a wavelength of 470 nm is strengthened in the pixel PxB. For this reason, in the embodiment, red light with the maximum luminance of light having the wavelength of 610 nm is emitted from the pixel PxR, green light with the maximum luminance of light having the wavelength of 540 nm is emitted from the pixel PxG, and blue light with the maximum luminance of the light having the wavelength of 470 nm is emitted from the pixel PxB.

An optical resonance structure provided in the pixel PxG, that is, an optical resonance structure including the light-emitting element 3G, the reflective layer 51, and the distance adjusting layer 52 is referred to as a resonance structure 35G. The resonance structure 35G is an example of a "first resonator" including the first light-emitting element and enhancing the light intensity of the first wavelength region. In addition, an optical resonance structure provided in the pixel PxB, that is, an optical resonance structure including the light-emitting element 3B, the reflective layer 51, and the distance adjusting layer 52 is referred to as a resonance structure 35B. In addition, an optical resonance structure provided in the pixel PxR, that is, an optical resonance structure including the light-emitting element 3R, the reflective layer 51, and the distance adjusting layer 52 is referred to as a resonance structure 35R. One of the resonance structure 35B and the resonance structure 35R is an example of a "second resonator" including the second light-emitting element and enhancing the light intensity of the second wavelength region.

The sealing layer 60 includes a lower sealing layer 61 stacked on the counter electrode 33, a planarizing layer 62 stacked on the lower sealing layer 61, and an upper sealing layer 63 stacked on the planarizing layer 62.

The lower sealing layer 61 and the upper sealing layer 63 are transparent layers having insulating properties and disposed so as to extend over the plurality of pixels Px. The lower sealing layer 61 and the upper sealing layer 63 are constituent elements for inhibiting entry of moisture, oxygen, or the like into the light-emitting layer 30 and are formed using an inorganic material such as silicon oxide (SiOx), silicon nitride (SiNx), or aluminum oxide (AlxOy), for example.

The planarizing layer 62 is a transparent layer disposed so as to straddle the plurality of pixels Px and is a constituent element for providing a flat upper surface (a surface on the +Z side). The planarizing layer 62 is formed using, for example, a resin material such as an epoxy resin, an acrylic resin, a urethane resin, a silicon resin, or an inorganic material such as silicon oxide.

The color filter layer 8 includes the color filter 8R, the color filter 8G, and the color filter 8B.

As shown in FIG. 4, the color filter 8G is formed on the upper sealing layer 63 so as to cover the light-emitting element 3G in a plan view on the +Z side of the light-emitting element 3G. In addition, the color filter 8B is formed on the upper sealing layer 63 and the color filter 8G so as to cover the light-emitting element 3B in a plan view on the +Z side of the light-emitting element 3B. In addition, the color filter 8R is formed on the upper sealing layer 63, the color filter 8G, and the color filter 8R so as to cover the light-emitting element 3R in a plan view on the +Z side of the light-emitting element 3R.

The color filter 8R is formed of a photosensitive resin material containing a red coloring material, the color filter 8G is formed of a photosensitive resin material containing a green coloring material, and the color filter 8B is formed of a photosensitive resin material containing a blue coloring material.

As shown in FIG. 4, the adhesive layer 90 is provided on the +Z side of the color filter layer 8 so as to cover the color filter layer 8, and the protective substrate 9 is provided on the +Z side of the adhesive layer 90.

3. Thickness of Sealing Layer and Color Filter Layer and Traveling Direction of Light Hereinafter, the relationship between the traveling direction of the light emitted from the light-emitting element 3 and the interval between the color filter layer 8 and the light-emitting element 3 will be described with reference to FIG. 5.

Figure 5:
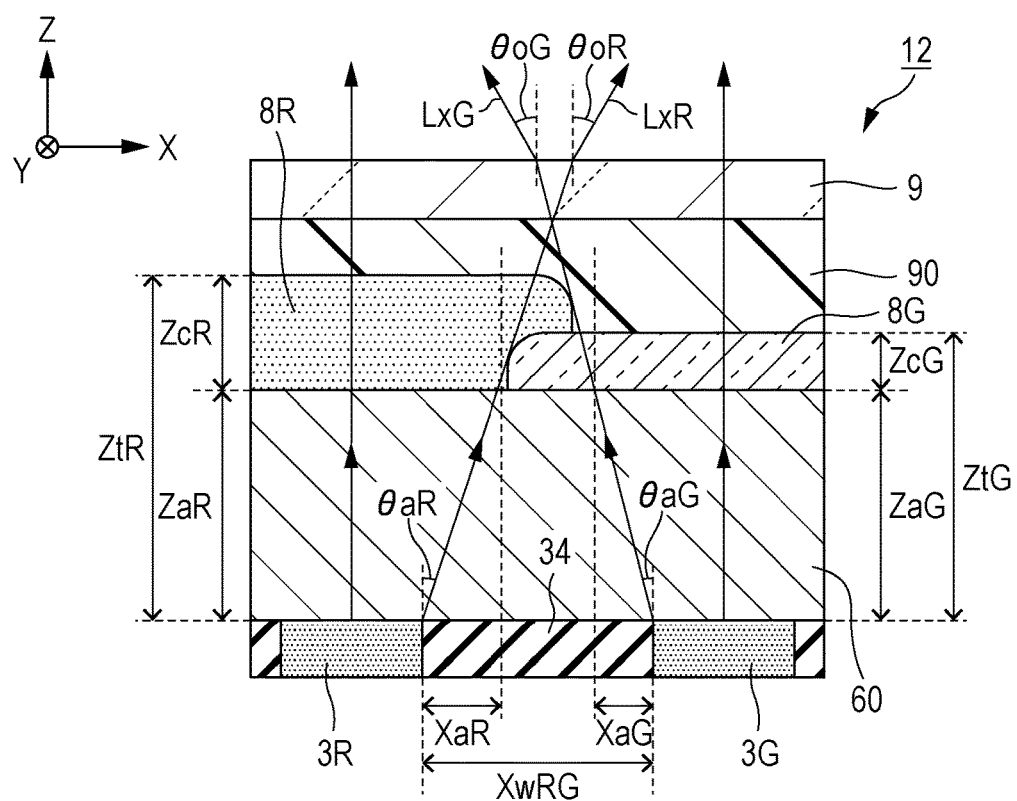
FIG. 5 is an explanatory view for explaining light emitted from a light-emitting element.

FIG. 5 is a view showing a portion including a cross section of the pixel PxR and a cross section of the pixel PxG in the partial cross-sectional view shown in FIG. 4.

Hereinafter, the thickness in the Z axis direction of the sealing layer 60 included in each pixel Px is referred to as a thickness Za. Then, when it is necessary to distinguish by RGB, the thickness Za corresponding to the pixel PxR is referred to as a thickness ZaR, the thickness Za corresponding to the pixel PxG is referred to as a thickness ZaG, the thickness Za corresponding to the pixel PxB is referred to as a thickness ZaB.

In addition, hereinafter, the maximum value of the thickness in the Z axis direction of the color filter included in each pixel Px is referred to as a thickness Zc. Then, when it is necessary to distinguish by RGB, the thickness Zc corresponding to the pixel PxR is referred to as a thickness ZcR, the thickness Zc corresponding to the pixel PxG is referred to as a thickness ZcG, the thickness Za corresponding to the pixel PxB is referred to as a thickness ZcB.

In addition, hereinafter, the sum of the thickness Za and the thickness Zc corresponding to each pixel Px is referred to as a thickness Zt. Then, when it is necessary to distinguish by RGB, the thickness Zt corresponding to the pixel PxR is referred to as a thickness ZtR, the thickness Zt corresponding to the pixel PxG is referred to as a thickness ZtG, the thickness Zt corresponding to the pixel PxB is referred to as a thickness ZtB.

In addition, hereinafter, the interval between two light-emitting elements 3 adjacent to each other is referred to as an interval Xw (an example of "inter-element distance"). Then, when it is necessary to distinguish by RGB, the interval Xw between adjacent light-emitting elements 3R and 3G is referred to as an interval XwRG, the interval Xw between adjacent light-emitting elements 3G and 3B is referred to as an interval XwGB, and the interval Xw between the light-emitting elements 3B and 3R is referred to as an interval XwBR.

In addition, hereinafter, the light spreading in the +X direction most among the light emitted from the +X side end portion of the light-emitting element 3 included in each pixel Px and transmitting through the color filter and the protective substrate 9 included the pixel Px, or the light spreading in the −X direction among the light emitted from the −X side end portion of the light-emitting element 3 included in each pixel Px and transmitting through the color filter and the protective substrate 9 included in the pixel Px is referred to as light Lx. Then, when it is necessary to distinguish by RGB, the light Lx corresponding to the pixel PxR is referred to as light LxR, the light Lx corresponding to the pixel PxG is referred to as light LxG, and the light Lx corresponding to the pixel PxB is referred to as light LxB.

In addition, hereinafter, when the light Lx emitted from each pixel Px reaches a position away from the light-emitting element 3 of the pixel Px by the thickness Za in the Z axis direction, the width in the X axis direction between the position and the light-emitting element 3 is referred to as a width Xa. Then, when it is necessary to distinguish by RGB, the width Xa corresponding to the pixel PxR is referred to as a width XaR, the width Xa corresponding to the pixel PxG is referred to as a width XaG, and the width Xa corresponding to the pixel PxB is referred to as a width XaB.

In addition, hereinafter, the angle formed between the light Lx emitted from the light-emitting element 3 and the Z axis direction is referred to as an angle θa, and the angle formed between the light Lx and the Z-axis direction after transmitting through the protective substrate 9 is referred to as an angle θo. Then, when it is necessary to distinguish by RGB, the angle θa and the angle θo corresponding to the pixel PxR are respectively referred to as an angle θaR and an angle θoR, the angle θa and the angle θo corresponding to the pixel PxG are respectively referred to as an angle θaG and an angle θoG, and the angle θa and the angle θo corresponding to the pixel PxB are respectively referred to as an angle θaB and an angle θoB.

The electro-optical device 1 according to the embodiment is characterized by satisfying the following two conditions.
Condition 1: the interval Xw between two adjacent light-emitting elements 3 is 1.5 μm or less.
Condition 2: the viewing angle of each pixel Px is 10 degrees or more, here, the viewing angle of the pixel Px is the light emitted from the light-emitting element 3 included in the pixel Px and is the maximum value of the angle formed between the traveling direction of the light transmitting through the color filter and the protective substrate 9 of the pixel Px and the Z axis direction.

In the embodiment, for convenience of description, by regarding the angle θo of the pixel Px as the viewing angle of the pixel Px, the condition 2 described above is embodied as the following condition 2A. That is, in the embodiment, the electro-optical device 1 shall satisfy the condition 1 and the following condition 2A.
Condition 2A: the angle θo of each pixel Px is 10 degrees or more.

Hereinafter, in order to satisfy the above conditions 1 and 2A, the conditions to be satisfied by the interval Xw and the thickness Za are examined.

First, the relationship between the thickness Za and the width Xa is expressed by the following equation (1).

$$Za = \frac{Xa}{\tan\theta a} \quad (1)$$

In the embodiment, it is assumed that the width Xa is less than half of the interval Xw. In this case, the equation (1) may be modified into the following expression (2).

$$Za \leq \frac{Xw}{2\tan\theta a} \quad (2)$$

Here, the absolute refractive index of the sealing layer 60 is Na, the absolute refractive index of air is No, and the relative refractive index of the sealing layer 60 with respect to air is Noa (=Na÷No). At this time, from the Snell's law, the following equation (3) is established, and equation (4) may be obtained by modifying equation (3).

$$Na * \sin\theta a = No * \sin\theta o \quad (3)$$

$$Noa = \frac{\sin\theta o}{\sin\theta a} \quad (4)$$

In addition, tan θa may be expressed using sin θa as in the following equation (5). Therefore, the equation (6) may be obtained from the equations (4) and (5).

$$\tan\theta a = \frac{\sin\theta a}{\sqrt{1 - \sin^2\theta a}} \quad (5)$$

$$\tan\theta a = \frac{\sin\theta o}{\sqrt{Noa^2 - \sin^2\theta o}} \quad (6)$$

Then, equation (7) is derived from equations (2) and (6).

$$Za \leq \frac{Xw}{2\sin\theta o}\sqrt{Noa^2 - \sin^2\theta o} \quad (7)$$

Here, when the ratio of the thickness Za with respect to the interval Xw is set to α (=Za÷Xw), the ratio α is expressed by the equation (8) obtained by modifying the equation (7).

$$\alpha \leq \frac{1}{2\sin\theta o}\sqrt{Noa^2 - \sin^2\theta o} \quad (8)$$

As described above, in order to satisfy the expression (7) or the expression (8), it is possible to set the angle θo of the light Lx emitted from each pixel Px to an angle equal to or larger than a desired angle by determining the thickness Za or the ratio α.

By the way, in general, the relative refractive index Noa of the sealing layer 60 is in the range of "1.4≤Noa≤1.9". In the embodiment, the relative refractive index Noa of the sealing layer 60 is set to "1.8". In this case, the ratio α for satisfying the condition 2A is "5.1" or less. Therefore, in order to make the angle θo 10 degrees or more, "α≤5", that is, the thickness Za is set to 5 times or less the interval Xw. Then, in the embodiment, since it is necessary to satisfy the condition 1 (Xw≤1.5 μm), the thickness Za is "Za≤7.5 μm".

In addition, in the embodiment, the thickness Zc of the color filter is determined so as to be in the range of "0.5*Xw≤Zc≤3.0*Xw". Furthermore, in the embodiment, the thickness ZcR, the thickness ZcG, and the thickness ZcB are determined so as to satisfy "ZcG<ZcB<ZcR". Therefore, in the embodiment, the thickness Zt is 8 times or less the interval Xw and is determined so as to satisfy "ZtG<ZtB<ZtR".

In the embodiment, the angle θo indicating the traveling direction of the light Lx emitted from the end portion of the light-emitting element 3 included in the pixel Px is regarded as the viewing angle of the pixel Px. However, in reality, light emitted from a position other than the end portion of the light-emitting element 3 included in the pixel Px may transmit through the color filter and the protective substrate 9. Therefore, the viewing angle sometimes becomes larger than the angle θo by, for example, "2 degrees". Therefore, the condition 2 may be embodied as the following condition 2B.

Condition 2B: the angle θo of each pixel Px is 8 degrees or more.

In a case where the relative refractive index Noa is "1.8", the ratio α for satisfying the condition 2B is "6.4" or less. Therefore, in order to set the viewing angle of each pixel Px to 10 degrees or more, "α≤6", that is, the thickness Za may be 6 times or less the interval Xw. Then, in this case, in order to satisfy the condition 1 (Xw≤1.5 μm), the thickness Za is "Za≤9 μm". In addition, in this case, the thickness Zt is 9 times or less the interval Xw and is determined so as to satisfy "ZtG<ZtB<ZtR".

4. Method for Manufacturing Electro-Optical Device

Hereinafter, an example of a method for manufacturing the electro-optical device 1 according to the embodiment will be described with reference to FIGS. 6 to 9.

Figure 6:
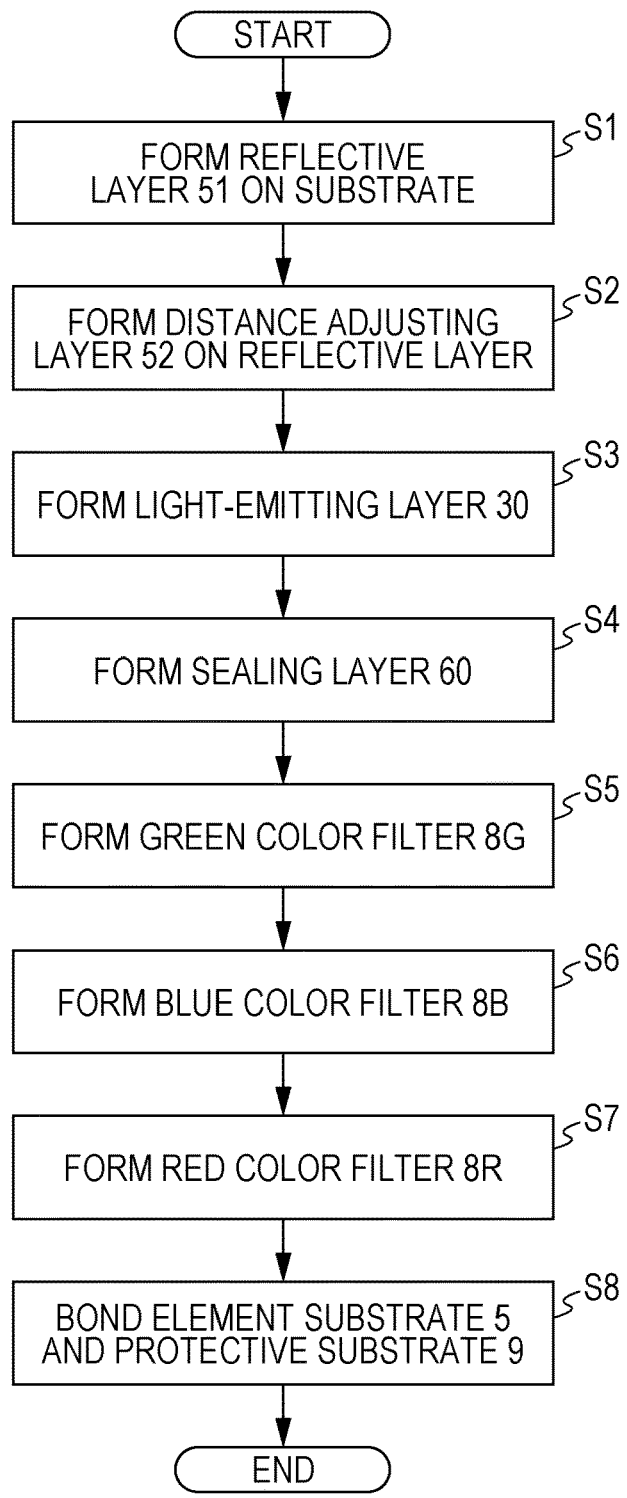
FIG. 6 is a flowchart showing an example of a manufacturing method for the electro-optical device.

FIG. 6 is a flowchart for explaining an example of a method for manufacturing the electro-optical device 1. As shown in FIG. 6, the method for manufacturing the electro-optical device 1 includes forming the reflective layer 51 on the substrate 50 (S1), forming the distance adjusting layer 52 on the reflective layer 51 (S2), forming the light-emitting layer 30 that has the light-emitting element 3R, the light-emitting element 3G, and the light-emitting element 3B on the distance adjusting layer 52 (S3); forming the sealing layer 60 on the light-emitting layer 30 (S4), forming the color filter 8G on the +Z side of the light-emitting element 3G of the light-emitting layer 30 on the upper sealing layer 63 of the sealing layer 60 (S5), forming the color filter 8B on the +Z side of the light-emitting element 3B that has the light-emitting layer 30 on the upper sealing layer 63 and on the color filter 8G (S6), forming the color filter 8R on the +Z side of the light-emitting element 3R that has the light-emitting layer 30 on the upper sealing layer 63, the color filter 8G, and the color filter 8B (S7), and forming the adhesive layer 90 on the color filter layer 8 and bonding the element substrate 5 and the protective substrate 9 with the adhesive layer 90 (S8).

An example of steps S5 to S7, which is a manufacturing process of the color filter layer 8 out of the above steps S1 to S8, will be described below.

Figure 7:
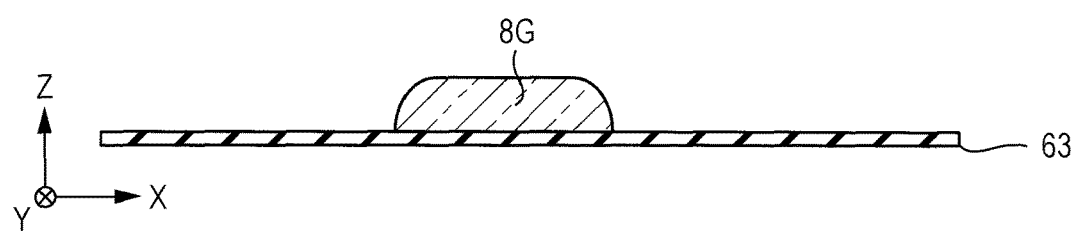
FIG. 7 is an explanatory view for explaining an example of the manufacturing method for the electro-optical device.

In step S5, first, a photosensitive resin material containing a green coloring material is applied onto the upper sealing layer 63 by a spin coating method and dried, whereby a green photosensitive resin layer is formed. Next, a portion of the green photosensitive resin layer forming the color filter 8G is irradiated with light and exposed, and a developing solution or the like is discharged to the photosensitive resin layer, whereby the unexposed photosensitive resin layer is removed. Thereafter, by burning and curing the green photosensitive resin layer, as shown in FIG. 7, the color filter 8G is formed on the upper sealing layer 63.

Figure 8:
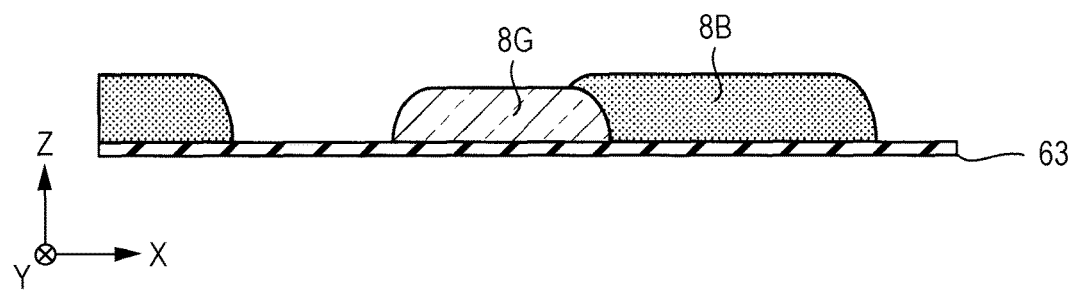
FIG. 8 is an explanatory view for explaining an example of the manufacturing method for the electro-optical device.

In the step S6, first, a photosensitive resin material containing a blue coloring material is applied onto the upper sealing layer 63 and the color filter 8G by the spin coat method and dried, whereby a blue photosensitive resin layer is formed. Next, a portion of the blue photosensitive resin layer forming the color filter 8B is irradiated with light and exposed, and a developing solution or the like is discharged to the photosensitive resin layer, whereby the unexposed photosensitive resin layer is removed. Thereafter, by burning and curing the blue photosensitive resin layer, as shown in FIG. 8, the color filter 8B is formed on the upper sealing layer 63 and the color filter 8G.

Figure 9:
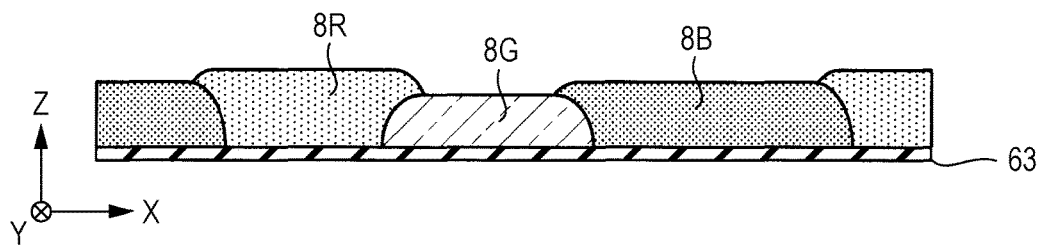
FIG. 9 is an explanatory view for explaining an example of the manufacturing method for the electro-optical device.

In the step S7, first, a photosensitive resin material containing a red coloring material is applied onto the upper sealing layer 63, the color filter 8G, and the color filter 8B by the spin coat method and dried, whereby a red photosensitive resin layer is formed. Next, a portion of the red photosensitive resin layer forming the color filter 8R is irradiated with light and exposed, and a developing solution or the like is discharged to the photosensitive resin layer, whereby the unexposed photosensitive resin layer is removed. Thereafter, by burning and curing the red photosensitive resin layer, as shown in FIG. 9, the color filter 8B is formed on the upper sealing layer 63, the color filter 8G, the color filter 8B, and the color filter 8R.

5. Effect of Embodiment

As described above, in the embodiment, the interval Xw between the light-emitting elements 3 is set to 1.5 μm or less and the thickness Za of the sealing layer 60 between the light-emitting element 3 and the color filter layer 8 is set to 5 times or less or 6 times or less the interval Xw. Therefore, in the electro-optical device 1 according to the embodiment, it is possible to secure a viewing angle of 10 degrees or more in each pixel Px. That is, according to the embodiment, even when the pixels Px are provided at a narrow pitch, it is possible to secure a sufficient viewing angle.

B. MODIFICATION EXAMPLE

Each of the above embodiments may be variously modified. Specific modification embodiments are exemplified below. Two or more embodiments arbitrarily selected from the following examples may be appropriately merged within a range not mutually contradictory. With respect to elements whose functions and functions are the same as those of the embodiment in the modification examples described below, the reference numerals referred to in the above description are used, and the detailed description thereof will be appropriately omitted.

Modification Example 1

In the above embodiment, in the display unit 12, the color filter layer 8 is formed so as to cover the entirety of the sealing layer 60, but the invention is not limited to such an aspect, and in the display unit 12, a convex pattern 7 (an example of "convex portion") may be formed between the sealing layer 60 and the color filter layer 8.

Figure 10:
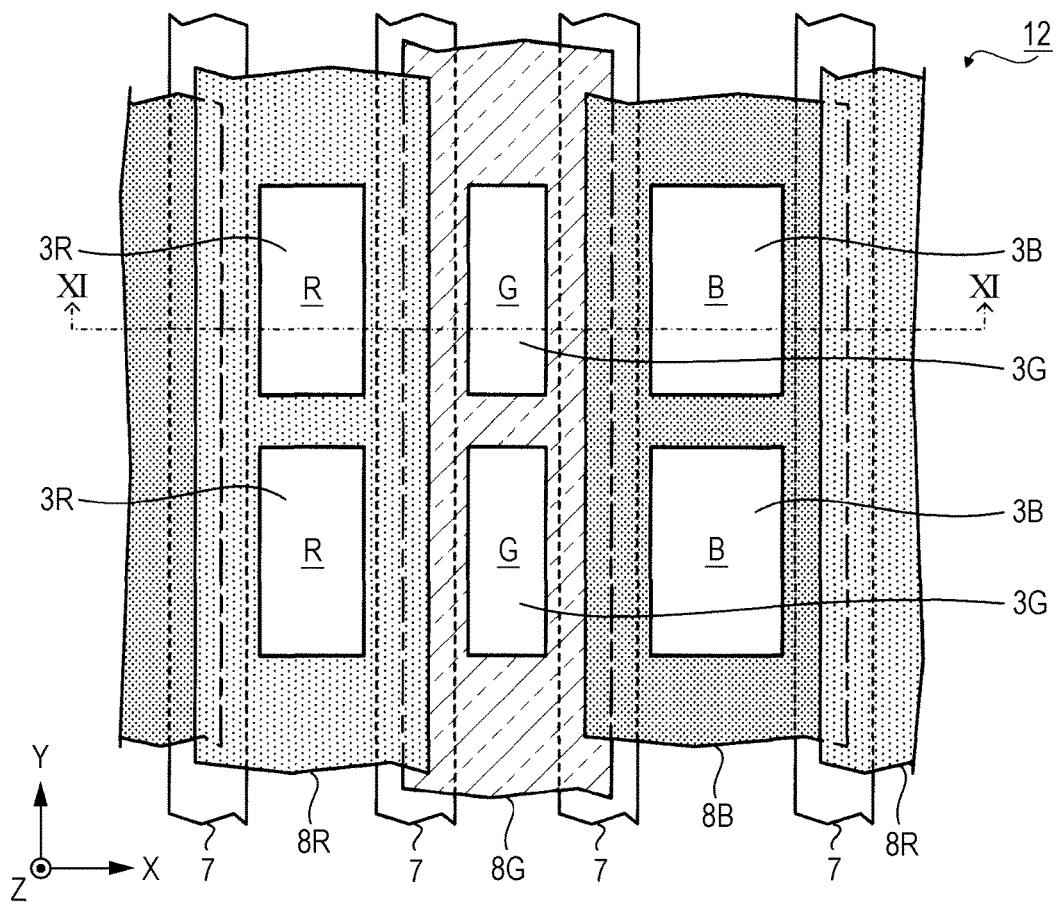
FIG. 10 is a plan view showing an example of a configuration of the display unit according to a modification example.

FIG. 10 is a plan view showing an example of a schematic structure of the display unit 12 according to a modification example 1.

As shown in FIG. 10, in the display unit 12 according to the present modification example, a plurality of convex patterns 7 extending in the Y axis direction are provided between two light-emitting elements 3 adjacent in the X axis direction. More specifically, in the display unit 12 according to the modification example, (N−1) columns of convex patterns 7 are provided so as to divide the N columns of pixels Px from the first column to the N-th column from each other. However, the convex pattern 7 may be provided on one or both of the −X side than the first row and the +X side than the N-th column.

Figure 11:
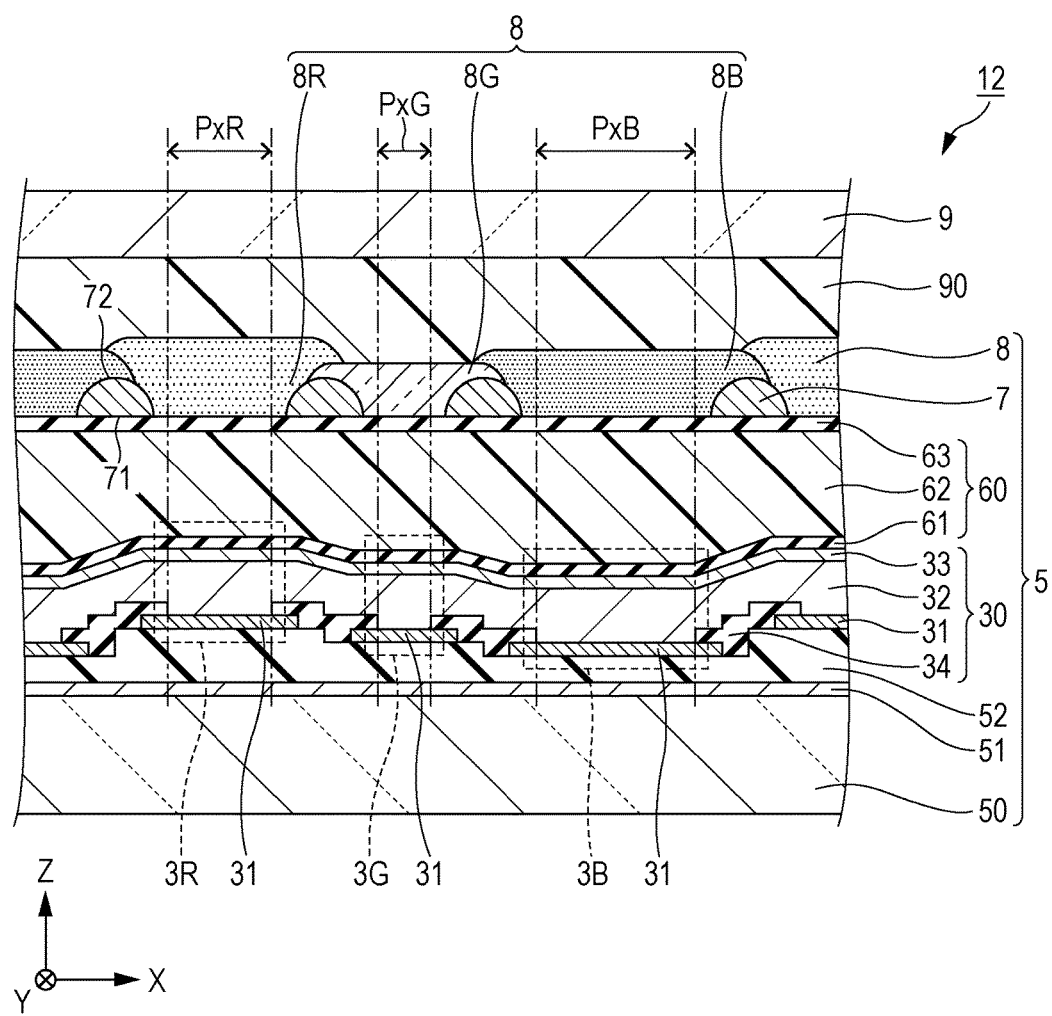
FIG. 11 is a partial cross-sectional view showing an example of the configuration of the display unit according to the modification example.

FIG. 11 is an example of a partial cross-sectional view taken along the line XI-XI in FIG. 10 of the display unit 12 according to modification example 1, in which the cross section of the pixel PxR, the cross section of the pixel PxG, and the cross section of the pixel PxB are included.

The convex pattern 7 is a transparent constituent element formed on the sealing layer 60 and includes a flat bottom surface 71 in contact with the sealing layer 60 and a curved upper surface 72 in contact with the color filter layer 8. The shape of the convex pattern 7 shown in FIG. 11 is an example, and the upper surface 72 of the convex pattern 7 may be a polyhedron or a shape having a corner.

The convex pattern 7 is formed using a transparent photosensitive resin material not containing a coloring material, for example, an acrylic resin. That is, the photosensitive resin material used as the material of the convex pattern 7 is the same material as the main material of the color filter layer 8.

In this modification example, as shown in FIG. 11, the color filter 8G is formed on the upper sealing layer 63 and on the convex pattern 7. In addition, the color filter 8B is formed on the upper sealing layer 63, the convex pattern 7, and the color filter 8G. In addition, the color filter 8R is formed on the upper sealing layer 63, the convex pattern 7, the color filter 8G, and the color filter 8B.

As described above, in this modification example, the convex pattern 7 is provided between the sealing layer 60 and the color filter layer 8. As described above, the convex pattern 7 is mainly formed of a photosensitive resin material not containing a coloring material. Generally, the bonding strength of a resin material not containing a coloring material is stronger than the bonding strength of a resin material containing a coloring material. Therefore, as in this modification example, in a case where a constituent element (hereinafter, referred to as a "constituent on the sealing layer") formed on the sealing layer 60 includes the convex pattern 7 containing no coloring material in addition to the color filter layer 8 containing a coloring material, the bonding strength of the constituent on the sealing layer to the sealing layer 60 may be increased as compared with the case where the sealing layer 60 is formed only from the color filter layer 8 containing a coloring material. Therefore, according to this modification example, in the manufacturing process of the electro-optical device 1 or the like, it is possible to reduce the possibility that the components on the sealing layer such as the color filter layer 8 peel off from the sealing layer 60.

In addition, in this modification example, the convex pattern 7 and the color filter layer 8 are formed using the same photosensitive resin material as a main component. Generally, the bonding strength between the constituent elements having the same main constituent is stronger than the bonding strength between constituent elements having different main constituents. Therefore, the bonding strength between the color filter layer 8 and the convex pattern 7 is stronger than the bonding strength between the color filter layer 8 and the sealing layer 60. Therefore, as in this modification example, since the constituent on the sealing layer has the convex pattern 7, it is possible to reduce the possibility that the color filter layer 8 peels off from the sealing layer 60.

In addition, in this modification example, the convex pattern 7 is formed so that the upper surface 72 is a curved surface. Then, in a case where the upper surface 72 of the convex pattern 7 is a curved surface, the adhesiveness between the color filter layer 8 formed on the upper surface 72 and the convex pattern 7 is higher as compared with the case where the upper surface 72 of the convex pattern 7 has a shape having a corner like a polyhedron. Therefore, according to this modification example, it is possible to strengthen the bonding strength of the convex pattern 7 and the color filter layer 8 as compared with the case where the upper surface 72 of the convex pattern 7 has a corner. In this way, it is possible to reduce the possibility that the color filter layer 8 peels off from the convex pattern 7 and the sealing layer 60.

Modification Example 2

In the embodiment and the modification example described above, after forming the color filter 8G, the color filter 8B is formed, and after forming the color filter 8B, the color filter 8R is formed, but the invention is not limited to such an embodiment, and the formation order of the color filters 8R, 8G, and 8B is arbitrary.

Modification Example 3

In the embodiment and the modification example described above, green light is used as an example of light in the first wavelength region, and blue light or red light is used as an example of light in the second wavelength region, but the invention is not limited to such an embodiment, and the light in the first wavelength region and the light in the second wavelength region may be visible light having different colors. Then, the first resonator including the first light-emitting element may be an optical resonance structure that emits light in the first wavelength region, and the second resonator including the second light-emitting element may be a light resonance structure that emits light in the second wavelength region. In addition, the first color filter may be a color filter that transmits light in the first wavelength region, and the second color filter may be a color filter that transmits light in the second wavelength region.

Modification Example 4

In the embodiment and the modification example described above, as a "condition 1", the interval Xw between adjacent light-emitting elements 3 is set to 1.5 µm or less, but the invention is not limited to such an embodiment, and the interval Xw may be set to 1.0 µm or less as the "condition 1", or the interval Xw may be set to 0.7 µm or less as the "condition 1". For example, in a case where the interval Xw is 1.0 µm or less, the thickness Za needs to be at least 6.0 µm or less, preferably 5.0 µm or less. In a case where the interval Xw is 0.7 µm or less, the thickness Za needs to be at least 4.2 µm or less, preferably 3.5 µm or less.

The interval XwRG, the interval XwGB, and the interval XwBR may be different from each other.

C. APPLICATION EXAMPLE

The electro-optical device 1 according to the embodiment and the modification examples described above may be applied to various electronic apparatuses. Hereinafter, the electronic apparatus according to the aspect of the invention will be described.

Figure 12:
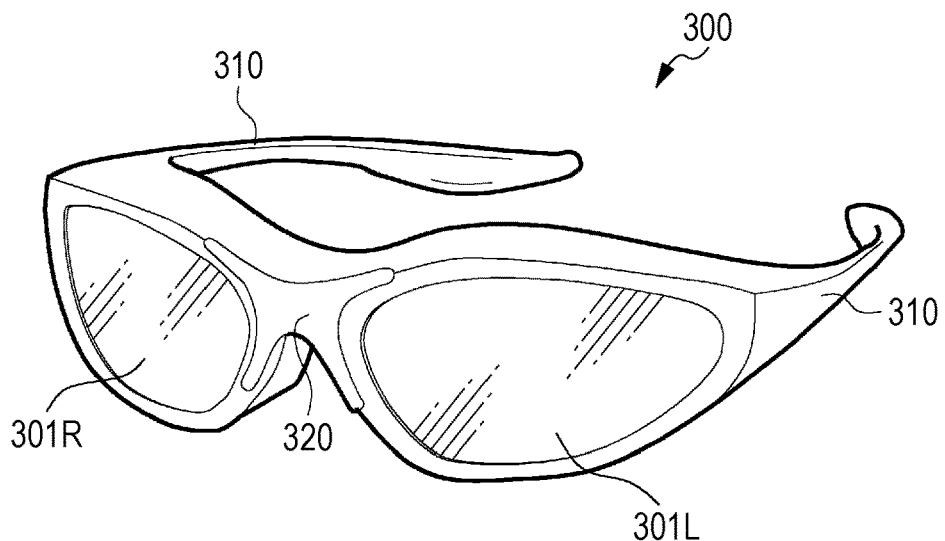
FIG. 12 is a perspective view of a head mounted display according to the invention.

FIG. 12 is a perspective view showing an appearance of a head mounted display 300 as an electronic apparatus employing the electro-optical device 1 of the aspect of the invention. As shown in FIG. 12, the head mounted display 300 includes a temple 310, a bridge 320, a projection optical system 301L, and a projection optical system 301R. Then, in FIG. 12, the electro-optical device 1 (not shown) for the left eye is provided behind the projection optical system 301L, and the electro-optical device 1 (not shown) for the right eye is provided behind the projection optical system 301R.

Figure 13:
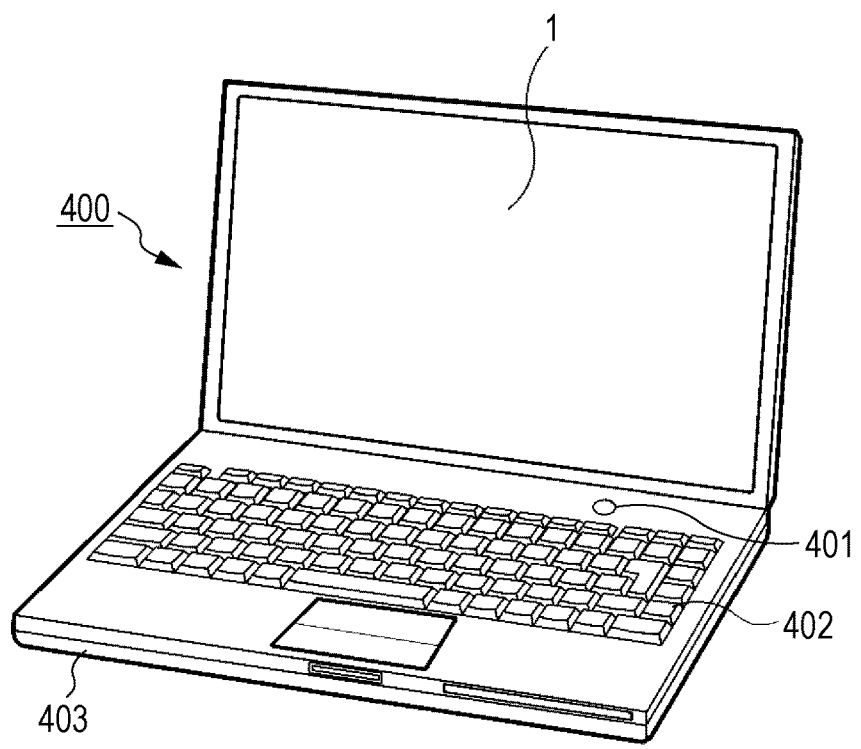
FIG. 13 is a perspective view of a personal computer according to the invention.

FIG. 13 is a perspective view of a portable personal computer 400 employing the electro-optical device 1. The personal computer 400 includes the electro-optical device 1 for displaying various images, and a main body unit 403 provided with a power switch 401 and a keyboard 402.

As an electronic apparatus to which the electro-optical device 1 according to the aspect of the invention is applied, in addition to the apparatuses exemplified in FIGS. 12 and 13, it is also possible to use a portable telephone, a smartphone, a personal digital assistant (PDA), a digital still camera, a television, a video camera, a car navigation device, an in-vehicle display device (instrument panel), an electronic notebook, an electronic paper, a calculator, a word processor, a workstation, a video phone, a POS terminal, and the like. Furthermore, the electro-optical device 1 according to the invention may be applied as a display unit provided in an electronic apparatus such as a printer, a scanner, a copying machine, and a video player.

The entire disclosure of Japanese Patent Application No. 2016-223711, filed Nov. 17, 2016 is expressly incorporated by reference herein.

What is claimed is:

1. An electro-optical device comprising:
a light-emitting layer that has a first light-emitting element and a second light-emitting element adjacent to each other;
a color filter layer that has a first color filter provided corresponding to the first light-emitting element and a second color filter provided corresponding to the second light-emitting element;
a first resonator that has the first light-emitting element and enhances an intensity of light in a first wavelength region; and
a second resonator that has the second light-emitting element and enhances an intensity of light in a second wavelength region,
wherein the first color filter transmits light from the first resonator,
the second color filter transmits light from the second resonator,
an inter-element distance between the first light-emitting element and the second light-emitting element is 1.5 µm or less, and
a thickness of layer between the light-emitting layer and the color filter layer is 6 times or less the inter-element distance.

2. An electro-optical device comprising:
a light-emitting layer that has a first light-emitting element and a second light-emitting element adjacent to each other;
a color filter layer that has a first color filter provided corresponding to the first light-emitting element and a second color filter provided corresponding to the second light-emitting element;
a filling layer that covers the color filter layer; and
a protective substrate that covers the filling layer,
wherein a maximum value of an angle that is formed by a traveling direction of the light emitted from the first light-emitting element and transmitted through the protective substrate after transmitting through the first color filter and the filling layer, and a direction perpendicular to the protective substrate is 10 degrees or more,
an inter-element distance between the first light-emitting element and the second light-emitting element is 1.5 µm or less, and
a thickness of layer between the light-emitting layer and the color filter layer is 6 times or less the inter-element distance.

3. An electro-optical device comprising:
a light-emitting layer that has a first light-emitting element and a second light-emitting element adjacent to each other;
a color filter layer that has a first color filter provided corresponding to the first light-emitting element and a second color filter provided corresponding to the second light-emitting element; and
a filling layer that covers the color filter layer,
wherein a thickness of layer between the light-emitting layer and the filling layer is 9 times or less the inter-element distance,
an inter-element distance between the first light-emitting element and the second light-emitting element is 1.5 µm or less, and
a thickness of layer between the light-emitting layer and the color filter layer is 6 times or less the inter-element distance.

4. The electro-optical device according to claim 1,
wherein the second color filter is formed on a part of the first color filter, and
the light transmitted through the first color filter has higher visibility than the light transmitted through the second color filter.

5. The electro-optical device according to claim 1, further comprising:
a sealing layer that is formed between the light-emitting layer and the color filter layer; and
a convex portion that is formed between the first color filter and the second color filter, that is between the sealing layer and the color filter layer.

6. A method for manufacturing an electro-optical device, comprising:
forming a light-emitting layer that includes a first light-emitting element and a second light-emitting element adjacent to each other;

forming a color filter layer that includes a first color filter corresponding to the first light-emitting element and a second color filter corresponding to the second light-emitting element, forming a first resonator that has the first light-emitting element and enhances an intensity of light in a first wavelength region; and forming a second resonator that has the second light-emitting element and enhances an intensity of light in a second wavelength region, wherein the first color filter transmits light from the first resonator, an inter-element distance between the first light-emitting element and the second light-emitting element is 1.5 µm or less, and a thickness of layer between the light-emitting layer and the color filter layer is 6 times or less the inter-element distance.

7. An electronic apparatus comprising:
the electro-optical device according to claim 1.

8. An electronic apparatus comprising:
the electro-optical device according to claim 2.

9. An electronic apparatus comprising:
the electro-optical device according to claim 3.

10. An electronic apparatus comprising:
the electro-optical device according to claim 4.

11. An electronic apparatus comprising:
the electro-optical device according to claim 5.

* * * * *